United States Patent [19]
Sitzmann et al.

[11] Patent Number: 6,054,250
[45] Date of Patent: Apr. 25, 2000

[54] HIGH TEMPERATURE PERFORMANCE POLYMERS FOR STEREOLITHOGRAPHY

[75] Inventors: Eugene V. Sitzmann, Des Plaines; Russell F. Anderson, Mt. Prospect; Mathias P. Koljack, Schaumburg; Julietta G. Cruz, Palatine, all of Ill.; Chandra M. Srivastava, East Hanover, N.J.

[73] Assignee: AlliedSignal Inc., Morristown, N.J.

[21] Appl. No.: 09/013,159

[22] Filed: Jan. 26, 1998

Related U.S. Application Data

[60] Provisional application No. 60/038,418, Feb. 18, 1997.

[51] Int. Cl.[7] .................................................. G03C 1/725
[52] U.S. Cl. ........................ 430/280.1; 522/103; 522/170
[58] Field of Search ..................... 430/280.1; 522/103, 522/170

[56] References Cited

U.S. PATENT DOCUMENTS

| | | | |
|---|---|---|---|
| 4,058,400 | 11/1977 | Crivello | 96/86 P |
| 4,575,330 | 3/1986 | Hull | 425/174.4 |
| 4,844,144 | 7/1989 | Murphy et al. | 164/35 |
| 4,942,001 | 7/1990 | Murphy et al. | 264/22 |
| 4,956,198 | 9/1990 | Shama et al. | 427/54.1 |
| 5,434,196 | 7/1995 | Ohkawa et al. | 522/100 |
| 5,510,226 | 4/1996 | Lapin et al. | 430/280.1 X |
| 5,512,608 | 4/1996 | Bachmann et al. | 522/170 |
| 5,605,941 | 2/1997 | Steinmann et al. | 522/170 |

FOREIGN PATENT DOCUMENTS

| | | |
|---|---|---|
| 0 605 361 A2 | 7/1994 | European Pat. Off. |
| 0 646 580 A2 | 4/1995 | European Pat. Off. |
| WO 89/08021 | 9/1989 | WIPO |
| WO 90/01512 | 2/1990 | WIPO |
| WO 92 20014 | 11/1992 | WIPO |
| WO 96 30182 | 10/1996 | WIPO |

OTHER PUBLICATIONS

Database WPI, Section Ch, Week 9211, Dewent Publications, Apr. 20, 1982.

Patent Abstracts of Japan, vol. 017, No. 266 (C–1062), May 25, 1993 & JP 05 005004 A (Ashai Denka Kogyo KK), Jan. 14, 1993.

Windholz Ed et al, The Merck Index, 9th Ed., Merck & Co, Inc. Rahway, N.J., 1976, Inside Cover, 1976.

*Primary Examiner*—Cynthia Hamilton
*Attorney, Agent, or Firm*—McDonnell Boehnen Hulbert & Berghoff

[57] ABSTRACT

The present invention relates to polymer precursors used in sterolithography. Specifically, the invention provides a novel resin having a glass transition temperature (Tg) that is substantially higher than any existing resins. The polymer precursors comprise an admixture of at least one vinyl ether, functionalized compound and at least one epoxy functionalized compound, at least one acrylate functionalized compound, and a photoinitiator, wherein the polymer precursor composition cures by a dual cure mechanism utilizing a free radical pathway as well as a cationic pathway thus yielding improved green strength.

15 Claims, No Drawings

HIGH TEMPERATURE PERFORMANCE POLYMERS FOR STEREOLITHOGRAPHY

This application claims priority to U.S. provisional patent application Ser. No. 60/038,418 filed on Feb. 18, 1997.

BACKGROUND OF THE INVENTION

(1) Field of the Invention

This invention concerns the art of stereolithography, which is a technique for forming solid shapes from a liquid polymer precursor. More particularly, the invention relates to improvements in such polymer precursors. The liquid polymer precursors of this invention produce green products having good strength at high glass transition temperatures. More particularly, this invention concerns a composition of matter useful in stereolithography that includes at least one vinyl ether, at least one epoxy, at least one acrylate and at least one photoinitiator. In addition, this invention is a stereolithography polymer precursor solution that includes a pyrene sensitizer.

(2) Description of the Art

Stereolithography is described in U.S. Pat. No. 4,575,330 to Hull. The method involves building up a predetermined three-dimensional shape by forming a series of layers of polymerized solids. A cross-section of the solid is traced out on the surface of a bath of polymer precursors under the direction of a computer controlled system which causes the liquid to be exposed to a form of radiation such as an ultraviolet laser. After each polymerized layer is formed, it is lowered in the bath so that a new layer can be formed on top.

Stereolithography solutions are disclosed in WO 89/08021 and U.S. Pat. No. 4,942,001. The references disclose the use of a formulation which combines both acrylates and methacrylates. The polymer precursor solution is comprised of resinous polyacrylates and polymethacrylates dissolved in liquid polyacrylates and polymethacrylates.

U.S. Pat. No. 4,844,144, discloses dispersing a thermoplastic material in a stereolithography liquid polymer precursor so that the solid formed by stereolithography contains a thermoplastic material. Such a solid polymer is said to be useful in the investment casting process since the thermoplastic material prevents the acrylate polymer from expanding when the solid is burned out of a mold. The acrylates and methacrylates used as polymer precursors are closely related to those disclosed in WO 89/08021 discussed above.

It is possible to employ polymer precursors based on vinyl ether compounds which have significant advantages over the acrylate-based formulations used heretofore in stereolithography. Vinyl ethers have been mentioned in publications relating to stereolithography. A vinyl ether urethane was disclosed in Example 6 of French Patent 2,355,794. It was combined with a diacrylate and cured by exposure to an electron beam. There was no suggestion in the French patent that such mixtures are useful in stereolithography, since the compositions apparently preceded the development of that technology.

The use of vinyl ethers in stereolithography was suggested in WO 90/01512, in combination with maleates or fumarates and in the presence of specific types of photoinitiators. In U.S. Pat. No. 4,956,198, coatings intended for use in optical glass fibers were said to have application to stereolithography as well. Such coatings included vinyl ether terminated polyurethane produced from certain diisocyanates reacting with polyols and then capping with monohydroxyl vinyl ethers.

WO 90/03989, addressed the use of vinyl ethers in stereolithography using a transvinylation reaction product to react with a diisocyanate to form urethane oligomers. The transvinylation reaction converted a polyhydric alcohol into products having one or more of the hydroxyl groups in the alcohol converted to a vinyl ether group. The mixture was then reacted with a diisocyanate via the residual hydroxyl groups to produce a vinyl ether urethane.

Vinyl ethers have been combined with epoxy compounds for use as coatings. For example, Crivello reported (Journal of Radiation Curing, Jan. 1983, p. 6–13) UV cure of vinyl ether-epoxy mixtures using cationic photoinitiators. The faster curing of vinyl ethers was advantageous, while the epoxy compounds provided their inherent properties to the film.

An important and still frequently encountered problem in using stereolithography fabricated plastic parts is their capacity to soften and subsequently distort at moderately elevated temperatures. This phenomenon to distort when heated can usually be traced to a moderate or low glass transition temperature (Tg) (most stereolithography parts exhibit a Tg in the range of 50° C. to 85° C.) which, ultimately is a function of the polymer precursors used to fabricate the parts. Another problem with current high accuracy stereolithography resins including resins based on epoxy-polyol/acrylate polymers is their water/humidity sensitivity. Water exposure leads to lower effective modulus of elasticity and lower dimensional accuracy rendering the stereolithography parts unsuitable for high temperature applications.

Further improvement in compositions useful in stereolithography have been sought, particularly with regard to improving the accuracy of the finished parts. The present invention relates to improved stereolithography polymer precursor compositions which provide advantages over those previously disclosed.

SUMMARY OF THE INVENTION

One object of this invention is a liquid polymer precursor composition that is useful in a sterolithography process to manufacture solid articles that are not tacky to the touch.

Another object of this invention is a liquid polymer precursor composition that is useful in a stereolithography process to manufacture a solid article that has a glass transition temperature (Tg) greater than the boiling point of water.

Yet another object of this invention is a liquid polymer precursor composition including vinyl ethers do not terminate polymerization by chain transfer.

Still another object of this invention is a liquid polymer precursor composition that produces a stereolithography product that is harder and less tacky than conventional stereolithography products.

A further object of this invention is a stereolithography polymer precursor that includes a pyrene sensitizer.

One embodiment of this invention is a liquid polymer precursor. The liquid polymer precursor includes at least one vinyl ether functionalized compound, at least one epoxy functionalized compound, at least one acrylate functionalized compound, and an effective amount of at least one photoinitiator.

In another embodiment, this invention is a liquid polymer precursor comprising from about 5 to about 15 weight percent of difunctional, and polyfunctional vinyl ether terminated monomers, oligomers and mixtures thereof, at least one cycloaliphatic diepoxy in an amount of from 4 to 7 times the amount of the vinyl ether present in the polymer precursor, at least one non-volatile diacrylate in an amount of from 3 to 5 times the amount of vinyl ether present in the polymer precursor, at least one cationic photoinitiator, at least one free radical photoinitiator, and at least one compound selected from an alcohol, a diol, a polyol, and mixtures thereof.

In yet another embodiment, this invention is a process for forming a three-dimensional object from a liquid polymer precursor of this invention comprising repeatedly exposing the surface of a bath of said precursor to a beam of actinic light to solidify successive layers of said precursor to make a green structure. The green is then cured.

In still another embodiment, this invention is a cured stereolithography product manufactured using the liquid polymer precursors of this invention.

DESCRIPTION OF THE CURRENT EMBODIMENT

The present invention includes novel polymer precursor compositions useful in stereolithography. In addition, the present invention is a method of manufacturing articles using the polymer precursor compositions of this invention in a stereolithography process. This invention includes stereolithography parts having a glass transition temperatures greater than the boiling point of water that are manufactured using the compositions of this invention.

The polymer precursor compositions of this invention are useful in the manufacture of stereolithography parts with improved Glass Transition temperatures (Tg) as well as low water sensitivity and long shelf-life. The polymer precursor compositions of this invention have a specific blend of vinyl ether, acrylate, and epoxy pre-polymers. The terms "vinyl ether" "epoxy", and "acrylate" as used herein each refer to a single individual compound and mixtures of like compounds. The compositions of this invention incorporate a novel photoinitiator package that improves the useful wavelength over which the polymer precursor compositions can be polymerized. The polymer precursor compositions of this invention can be formed into a high melting point solid product using a stereolithography process.

The vinyl ether functionalized compounds useful in compositions of this invention include any vinyl ether composition including, but not limited to those described in U.S. Pat. No. 5,510,226 which is incorporated herein by reference.

Vinyl ether functionalized compounds useful in the compositions of this invention include all vinyl ether terminated monomers and oligomers known to one of skill in the art to be useful in a stereolithography polymer precursor solutions and mixtures thereof. Useful vinyl ethers have as many as possible of the following properties: fast cure under UV laser exposure, a relatively high modulus of elasticity as first formed by the laser beam; and have minimal absorption of light from the laser beam.

The vinyl ethers may be monofunctional, difunctional or polyfunctional vinyl ethers with difunctional and polyfunctional vinyl ether terminated monomers and oligomers being preferred. Most preferred are difunctional vinyl ethers capable of promoting a high modulus such as bis-(4-vinyloxy butyl) isophthalate.

Epoxy functionalized compounds useful in the compositions of this invention include any epoxy pre-polymers recognized by one having skill in the art as being useful in stereolithography polymer precursor solutions and mixtures thereof. The epoxides which are most useful in the compositions of this invention should have as many of the following properties as possible: a functionality of at least two; a high cure rate relative to the vinyl ethers used in the formulation; contribute a low viscosity to the formulation; miscibility with the selected vinyl ethers; and minimal absorption of light from the selected laser beam.

Preferred epoxy functional groups include those derived from phenols, such as bisphenol A, novolacs, linear and cycloaliphatic diols, and of particular glycidyl ethers of phenols. Examples of glycidyl ethers are bisphenol A diglycidyl ethers (e.g. DER 331, 332, Dow Chemical and Epon 828, Shell Chemical). Other examples are epoxy novolacs (e.g. Quatrex 240, DEN 431, Dow Chemical) and epoxy cresols (e.g. Quatrex 3310, Dow Chemical).

Most preferred epoxy functionalized compounds are cycloaliphatic epoxy compounds and especially cycloaliphatic diepoxies. Cycloaliphatic diepoxies are preferred because they effectively compete with vinyl ether functional groups for photo-generated acids. By having the epoxy functionalized compounds scavenge the photo generated acids, in the preference to the vinyl ethers the vinyl ethers can effectively be incorporated into a growing radical initiated acrylate copolymer. By permitting the vinyl ether to react to selectively form a vinyl ether acrylate copolymer higher product Tg's are attained. Examples of useful cycloaliphatic epoxides include ERL-4221, ERL-4299, ERL-4234, manufactured by Union Carbide and:

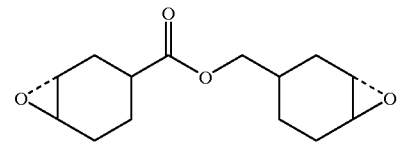

Any acrylate functional group may be used in the present composition and UVA 1500 manufactured by having the following formula: acrylate functional groups include one or more acrylates and mixtures of acrylates and methacrylates. Preferred acrylates functional compounds are moderate to low viscosity non-volatile acrylates with aromatic groups. Examples of useful acrylates include EDBA, Ebecryl. The acrylate used may be mono-, di-, tri- or polyfunctional acrylates or mixtures thereof. It is preferred that the acrylate is di-functional and a polyether ether or polyether acrylate. A most preferred acrylate is ethoxylated bisphenol diacrylate. It is also preferred that the chosen acrylate has a molecular weight of from about 300 to about 1000.

The relative amounts of vinyl ether, epoxy, and acrylate compounds in the polymer precursor compositions of this invention is important. By choosing the proper relative amount of ingredients, the vinyl ether undergoes a radical polymerization, a opposed to its generally more efficient cationic route (which is followed by the epoxies), which, in turn, gives high Tg thermoset stereolithography products with good flexibility and tack free surfaces in cured stereolithography parts.

An important aspect to this invention is the manner in which the VE is selectively and preferentially incorporated into the acrylate polymer. This is accomplished using a specific epoxy and adjusting the amount of acrylate and vinyl ether as well as the relative amounts of cationic photoinitiator to radical photoinitiators to achieve the desired polymerization route and rates.

Upon photoirradiation, the polymer precursor composition of this invention undergoes photopolymerization to form an interpenetrating network (IPN) consisting of a predominately acrylate-vinyl ether copolymer with an epoxy polymer. The highly cross-linked thermoset exhibit a high Tg and HDT. The composition also shows flexibility/ductility, water insensitivity during photofabrication and after, low color, and fast photoresponse.

The preferred weights of the polymer precursor ingredients in the compositions of this invention are based upon the amount of vinyl ether in the composition. The amount of vinyl ether functionalized compound in the composition should range from about 5 to about 25 weight percent and preferably from about 5 to about 15 weight percent vinyl ether in the final composition. At least one epoxy functionalized compound is present in the composition in an amount ranging from about 2 to about 10 times the weight of vinyl ether, and preferably from about 4 to about 7 times the weight of vinyl ether functionalized compound in the composition. Finally, the acrylate functionalized compound is present in the composition in an amount ranging from about 2 to about 8 times the weight of vinyl ether functionalized compound in the composition and preferably from about 3 to about 5 times the weight of the vinyl ether functionalized compound in the composition.

The compositions of this invention include a photoinitiator. The photoinitiator may be one or more compositions that are useful in initiating polymerzation of the composition of this invention upon excitation by a wavelength of radiation from about 300 to about 380 nm. The photoinitiator is preferably a combination of at least one cationic photoinitiator and ate least one free radical photoinitiator.

An effective amount of a cationic photoinitiator is used to cause the epoxies to react and produce the desired polymer. The recognized classes of cationic photoinitiators include various compounds which respond to irradiation by producing acid species capable of catalyzing cationic polymerization. See Crivello, Advances in Polymer Science, 62, p. 1–48 (1984). Onium salts of Group V, VI, and VII elements are stated to be the most efficient and versatile of the cationic photoinitiators. They generate strong Lewis acids which can promote cationic polymerization. Curing the compositions of the invention is not limited to a particular class of such photoinitiators, although certain types are preferred, including onium salts based on halogens and sulfur. More specifically, the onium salt photoinitiators described in Crivello's U.S. Pat. No. 4,058,400 and in particular iodonium and sulfonium salts of $BF_4$, $PF_6$, $SbF_6$, and $SO_3CF_3$. Preferred photoinitiators are triarylsulfonium salts, and diaryliodonium salts. Preferred anions are hexafluorophosphate and hexafluoroantimony. The composition of this invention will include from about 0.1 to about 2.0 pph of a cationic photoinitiator and preferably from about 0.5 to about 1.5 phh of a cationic photoinitiator.

The choice of cationic photoinitiator depends on the excitation wavelength. For example at a wavelength of 324 nm triaryl sulfonium hexafluoroantimonate salts are useful and above 355 nm or $N_2YO_4$ is useful.

Most preferred cationic photoinitiators include $Ar^5S^+$ $SbF_6^-$, and $Ar^{12}I^-$ coupled with phosphate or antimimate counterions, and mixtures thereof either alone or in combination with other photoinitiators such as phosphate salts, sulfonium salts and iodonium salts.

The photoinitiator package used to form multi-layered SL parts from the vinyl/acrylate/epoxy polymer precursor compositions will preferably include a free radical photoinitiator (for example, a substituted acetophenone) in addition to or in lieu of a cationic photoinitiator. A free radical photoinitiator is useful for promoting free radical polymerization and typically absorbs light in the mid UV range of from 300–360 nm and undergoes Norrish Type I photocleavage. Examples of useful radical photoinitiators include the free radical photoinitiator will preferably be present in the compositions of this invention in amount ranging from about 0.5 to about 4.0 wt % and preferably from about 1.0 to about 2.0 wt %. Quinones such as 2-ethyl anthraquimone, 2-t-butyl anthraquinone, octamethyl althraquinone, and 1,2-benzanthraquinone; α-ketaldonyl alcohols or others such as benzoin, pivaloin, and acyloin ether, ketones such as α-phenyl benzoin, α-α'-diethoxy acc(ophenone, benzophenone, 4,4'-bisdialkylamino benzopherione; thioxamthoric derivates; 2,4,5-triaryl imidazolyl dimers and the like. These compounds can be used alone or as a mixture of two or more.

The compositions of this invention preferably include at least one alcohol, diol, or polyol. Alcohols, diols, and polyols facilitate the speed of epoxy crosslinking reaction which lowers the Tg of the resulting stereolithography matrix thereby improving the flexibility of resulting product. Any alcohol, polyether diol or polyol may be used in the compositions of this invention. Diols are preferred, however to keep the hydroxy functionally low. It is also preferred that diols and polyols with a molecular weight of at least 200 are and most preferably greater than 500 are used in the composition. Alcohols, diols, polyols and mixtures thereof will preferably be included in composition of this invention in amounts ranging from about 5.0 to about 15.0 weight percent.

The polymer precursor composition of this invention may include a stabilizer to maintain good vat-life stability. A useful stabilizer should be a weak Lewis base.

An important aspect of this invention is our discovery that an aromatic sensitizer, and, in particular, pyrene, significantly enhances the cationic cure rate of all types of stereolithography polymer precursor solutions. The aromatic sensitizer provides a more efficacious solution gel point using less light. Pyrene has heretofore never been appreciated as a useful stereolithography polymer precursor sensitizer. To be most effective, the preferred pyrene sensitizer should be present in a polymer precursor solution in an amount ranging from about 0.05 to about 0.5 pph, and preferably from about 0.1 to about 0.3 pph.

An important factor in selecting vinyl ethers and epoxides for use in stereolithography compositions of this invention is the viscosity of the resulting formulation. In general, the compositions of this invention should have a viscosity in the range of 200 to about 10,000 centipoise and preferably from 200–800 centipoise. The viscosity of the formulation are low to facilitate the movement of the liquid prepolymers over the solid piece being formed by the stereolithography apparatus.

In addition to the principal ingredients discussed above, the formulations may also contain dyes, stabilizers, fillers, pigments, and antioxidants such as hindered phenols, wetting agents such as fluorosurfactants e.g. FC-430 from 3-M, photosensitizers such as benzophenone, thioxanthone, perylene and other components familiar to those skilled in the art.

The vinyl ether acrylate/epoxy formulations of this invention may be polymerized by exposure to known sources of energy such as electron beams, ultraviolet light, high temperatures, and the like. In stereolithographic applications, the polymer formulation forms a liquid bath in which the precursors are polymerized in successive layers, typically by repeated exposure to actinic light, particularly a UV or visible laser beam, such as ultraviolet light from helium/cadmium laser or an argon ion laser or visible light from an argon ion laser. After the three-dimensional shape has been formed, it is removed from the bath, washed as necessary with isopropanol or other suitable solvent, and cured further by thermal means, which could be supplemented by ultraviolet or visible light means if desired.

EXAMPLE 1

Compositions of this invention having the formulas reported in Table I below were prepared by combining the ingredients in a container. The order of incorporation of the ingredients is unimportant. A legend indicating the chemical name for each component is found at Table II.

The compositions were coated on a glass plate and cured by UV irradiation at 500 mj/cm $^2$ using a medium pressure mercury arc lamp. Thereafter the green films were removed from the glass plates and thermally postcured for 10 minutes at 160° C. The properties of the postcured films were measured and reported below in Table 1.

TABLE 1

| | Formula | Viscosity at 30° C. (cps) | Ec mJ/cm$^2$ | Dp (mil) | Tg (° C.) | Modulus (KSI) (cured) | Elongation % (Cured) | Viscosity @ 30° C. (cps) Zero Days | Viscosity @ 30° C. (cps) 3 DAYS @ 80° C. |
|---|---|---|---|---|---|---|---|---|---|
| 1 | 36% EBDA 9% DVE-3 55% 1500 2 pph I-651 0.6 pph CD 1010 0.175 Pyrene | 167 | 8.76 | 4.7 | 127.3 | 261 | 4.6 | 167 | 186 |
| 2 | 36% EBDA 9% PFO 650 55% 1500 2 pph I-651 0.6 pph CD 1010 0.175 Pyrene | 575 | 4.57 | 3.94 | 124.3 | 255 | 4.3 | 575 | 748 |
| 3 | 36% EBDA 9% Tone 0301 55% 1500 2 pph I-651 0.6 pph CD 1010 0.175 Pyrene | 393 | 5.15 | 3.95 | 127.4 | 264 | 5.4 | 393 | 528 |
| 4 | 36% EBDA 9% Ebecryl 3605 55% 1500 2 pph I-651 0.6 pph CD 1010 0.175 Pyrene | 573 | 5.29 | 4.25 | 145.5 | 286 | 4.9 | 573 | 1256 |
| 5 | 36% EBDA 9% BHTD 55% 1500 2 pph I-651 0.6 pph CD 1010 0.175 Pyrene | 436 | 5.84 | 4.17 | 142.7 | 279 | 4.5 | 436 | 615 |
| 6 | 39.6% EBDA 60.4% 1500 1.5 pph I-651 2 pph CD 1010 | 394 | 9.07 | 5.9 | 127.4 | 288 | 5.2 | 394 | gelled |
| 7 | 36% EBDA 9% 4010SF(D2) 55% 1500 2 pph I-651 0.6 pph CD 1010 0.175 Pyrene | 320 | 8.4 | 4.5 | 127.4 | 275 | 5.1 | 320 | 430 |
| 8 | 36% EBDA 9% Poly THF-650 diol 55% 1500 2 pph I-651 0.6 pph CD 1010 0.175 Pyrene | 335 | 9.5 | 4.4 | 112.5 | 254 | 5.6 | 335 | 442 |
| 9 | 33% EBDA 15% Poly THF-650 diol 52% 1500 2 pph I-651 0.6 pph CD 1010 0.175 Pyrene | 311 | 7.3 | 3.9 | 115.4 | 222 | 8.5 | 311 | 376 |
| 10 | 32% EBDA 5% Tone 0301 55% 1500 8% VE-4010 2 pph I-651 | 310 | 6.9 | 4.3 | 121.3 | 269 | 4.9 | 310 | GELLED |

TABLE 1-continued

| | Formula | Viscosity at 30° C. (cps) | Ec mJ/cm$^2$ | Dp (mil) | Tg (° C.) | Modulus (KSI) (cured) | Elongation % (Cured) | Viscosity @ 30° C. (cps) Zero Days | Viscosity @ 30° C. (cps) 3 DAYS @ 80° C. |
|---|---|---|---|---|---|---|---|---|---|
| | 0.6 pph CD 1010 0.175 Pyrene | | | | | | | | |
| 11 | 30% EBDA 8% Tone 0301 55% 1500 7% VE-4010 2 pph I-651 0.6 pph CD 1010 0.175 Pyrene | 322 | 8 | 4.3 | 118.3 | 263 | 5 | 322 | GELLED |
| 12 | 32% EBDA 5% THF 650 diol 55% 1500 8% VE-4010 2 pph I-651 0.6 pph CD 1010 0.175 Pyrene | | 7.7 | 4.48 | | 238 | 6.78 | | |
| 13 | 32% EBDA 5% Polybutadiene epoxy 55% 1500 8% VE-4010 2.55 pph I-651 0.6 pph CD 1010 | | 8.46 | 5.65 | | | | | |
| 14 | 32% EBDA 5% Plurocol 1044 55% 1500 8% VE-4010 2.00 pph I-651 0.6 pph CD 1010 0.175 pph pyrene | | 5.76 | 4.16 | | | | | |
| 15 | 36% EBDA 55% ERL-4299 9% VE-4010 2.00 pph I-651 0.6 pph CD 1010 0.175 pph pyrene | | 4.86 | 4.53 | | | | | |
| 16 | 36% EBDA 55% 1500 9% VE-4010 1.00 pph I-651 0.6 pph CD 1010 1.4 pph UVI-6990 | | 14.3 | 7.26 | | | | | |
| 17 | 36% EBDA 55% 1500 9% VE-4010 2.00 pph I-651 0.6 pph CD 1010 1.4 pph UVI-6990 | | 6.65 | 4.92 | | | | | |
| 18 | 36% EBDA 54% ERL-4299 1% DER 732 9% VE-4010 2.00 pph I-651 0.6 pph CD 1010 0.175 pph pyrene | | 7.57 | 5.03 | | | | | |
| 19 | 36% EBDA 50% ERL-4299 5% DER 732 9% VE-4010 2.00 pph I-651 0.6 pph CD 1010 0.175 pph pyrene | | 6.9 | 4.84 | | | | | |
| 20 | 36% EBDA 45% 1500 10% ERL-4299 9% VE-4010 2.00 pph I-651 0.6 pph CD 1010 0.175 pph pyrene | | 6.02 | 4.74 | | | | | |
| 21 | 34.8% EBDA 16.3% Tone 0.301 48.9% 6110 0% VE-4010 2 pph I-651 1.0 pph CD 1010 | | | | 100.7 | 263.5 | | 4.58 | |

TABLE 1-continued

| Formula | Viscosity at 30° C. (cps) | Ec mJ/cm$^2$ | Dp (mil) | Tg (° C.) | Modulus (KSI) (cured) | Elongation % (Cured) | Viscosity @ 30° C. (cps) Zero Days | Viscosity @ 30° C. (cps) 3 DAYS @ 80° C. |
|---|---|---|---|---|---|---|---|---|
| 22 32% EBDA<br>5% THF650 diol<br>55% 1500<br>8% VE-4010<br>2 pph I-651<br>0.6 pph CD 1010<br>0.175 Pyrene | | | | 118.4 | 238.3 | | 6.8 | |
| 23 30% EBDA<br>8% THF650 diol<br>55% 1500<br>7% VE-4010<br>2 pph I-651<br>0.6 pph CD 1010<br>0.175 Pyrene | | | | 124.6 | 220.8 | | 6.5 | |
| 24 32% EBDA<br>15% Tone 0301<br>45% 1500<br>8% VE-4010<br>1 pph I-651<br>2 pph CD 1010 | | | | | 257.9 | | 3.99 | |
| 25 45% 6110<br>15% THF 650 diol<br>32% SR-349<br>8% 4010 Std.<br>1 pph I-651<br>2 pph CD 1010 | | | | | 197.1 | | 5.81 | |

The results of the testing indicate that stereolithography products prepared using the polymer precursor solutions of this invention exhibit excellent strength and temperature resistance.

TABLE 2

| Vinyl Ether Functionalized Compounds | | |
|---|---|---|
| Trade Name | Type | Name and/or Chemical Structure |
| DVE-3 (ISP's trade name) | Vinyl Ether | triethyleneglycol divinyl ether |
| PFO 650 | Poly vinyl ether oligomer | polyfuncational vinyl ether oligomer |
| Ebecryl 3605 (UCB trade name) | acrylated epoxy oligomer | A partially acrylated bisphenol A epoxy resin |
| 4010SF(D2) | vinyl ether | 1,3-Benzenedicarboxylic acid, bis [4-(ethenyloxy)butyl]ester |
| VE-4010 (Allied Signal trade name) | vinyl ether | 1,3-Benzenedicarboxylic acid, bis [4-(ethenyloxy)butyl]ester |

| Poly Compounds | | |
|---|---|---|
| Trade Name | Type | Name and/or Chemical Structure |
| Poly THF-650 diol | diol | hydroxy terminated polytetrahydrofuran |
| Plurocol 1044 | polyol | |
| Tone 0301 | polyol | ε-Caprolactane Triol |
| BHTD | diol | bis(hydroxy methyl) - tricyclo [5.2.1.0]decane |

| Epoxy Functionalized Compounds | | |
|---|---|---|
| Trade Name | Type | Name and/or Chemical Structure |
| ERL-4299 (Union Carbide cycloaliphatic epoxyresin) | epoxy | bis(3,4 cyclohexyl methyl) adipate |
| 1500 (UBC trade name for cycloaliphatic epoxy) | cycloaliphatic epoxy | 3,4-epoxycyclohexylmethyl-3,4-epoxycyclohexylacarboxylate |
| 6110 (Union Carbide trade name for cycloaliphatic epoxy) | cycloaliphatic epoxy | 3,4-epoxycyclohexylmethyl-3,4-epoxycyclohexylacarboxylate |
| 1500 (Sartomer trade name) | cycloaliphatic epoxy | 3,4-epoxycyclohexylmethyl-3,4-epoxycyclohexylacarboxylate |
| DER 732 (Dow Chemical | aliphatic epoxy | polyglycol di-glycidyl ether |

TABLE 2-continued

| trade name) | | |
|---|---|---|
| ERL-4229 (Union Carbide trade name) | epoxy | bis(3,4 cyclohexyl methyl) adipate |
| 6110 (Union Carbide trade name | cycloaliphatic epoxy | |
| Ebecryl 3605 (UCB trade name) | acrylated epoxy oligomer | A partially acrylated bisphenol A epoxy resin |

| Acrylate Functionalized Compounds | | |
|---|---|---|
| Trade Name | Type | Name and/or Chemical Structure |
| EBDA | Diacrylate | ethoxylated bis phenol A diacrylate |
| SR-349 (Sartomer trade name for EBDA) | Diacrylate | ethoxylated bis phenol A diacrylate |
| Ebecryl 3605 (UCB trade name | acrylated epoxy oligomer | A partially acrylated bisphenol A epoxy resin |

| Photo Initiators | | |
|---|---|---|
| Trade Name | Type | Name and/or Chemical Structure |
| I-651 (Ciba trade name; Irgacure 651) | radical photoiniator | alpha-dimethoxy-alpha-phenylacetophenone |
| CD 1010 (Sartomer trade name) | cationic photoinitiator | Mixed triarylsulfonium hexafluoroantimonate salts |

EXAMPLE 2

This Example evaluates the effect of adding a pyrene stabilizer to a stereolithography precursor composition. Two polymer precursor compositions of this invention, one with pyrene stabilizer, and one without were coated onto a glass plate, exposed to actinic light, and cured according to the method described in Example 1. The compositions and test results are reported in Table 3, below.

TABLE 3

| | Formula | Viscosity at 30° C. (cps) | Ec (mJ/cm$^2$) | Dp (mil) | Tg (° C.) | Modulus (KSI) cured | Elongation % (cured) | Viscosity @°30' C. (cps) Zero Days | Viscosity @ 30° C. (cps) 3 DAYS @°80° C. |
|---|---|---|---|---|---|---|---|---|---|
| 1 | 36% EBDA<br>9% 4010 STD<br>55% 1500<br><br>2 pph I-651<br>0.6 pph CD 1010<br>0.175 Pyrene | 306 | 7.4 | 4.3 | 130.5 | 276 | 4.1 | 610<br>(@22° C.)<br>306 | 757<br><br>319<br>(95% RH) |
| 2 | 36% EBDA<br>55% 1500<br>9% VE-4010<br>2.55 pph I-651<br>0.6 pph CD 1010 | | 3.6 | 5.21 | | 274 | 3.58 | 301 | 385 |

The test results indicate that polymer precursor solutions stabilized with pyrene maintain their viscosities, i.e, are protected against cross-linking and polymerization in comparison to the same polymer precursor solution that contains no pyrene.

What we claim is:

1. A liquid polymer precursor comprising:
   from about 5 to about 15 weight percent of at least one vinyl ether functionalized compound;
   an amount of at least one epoxy functionalized compound ranging from about 2 to about 10 times the weight of vinyl ether functionalized compound in the precursor composition;
   an amount of at least one acrylate functionalized compound ranging from about 2 to about 8 times the weight of vinyl ether functionalized compound in the precursor composition; and
   at least one photoinitiator wherein the epoxy functionalized compounds, the vinyl ether functionalized compounds and the acrylate functionalized compounds are present in the composition in an amount sufficient to ensure that upon photoinitiation, the epoxy functionalized compounds polymerize primarily by cationic chain transfer polymerization and wherein the vinyl ether functionalized compounds polymerize primarily by radical polymerization and combine with the acrylate functionalized compounds to form a copolymer.

2. The liquid polymer precursor of claim 1 wherein the photoinitiator is from about 1.0 to about 3.0 pph of a cationic photoinitiator and from about 0.4 to about 4.0 wt % of a free radical photoiniator.

3. The liquid polymer precursor of claim 2 wherein the cationic photoinitiator is selected from the group consisting of $Ar_3S^+SbF_6^-$ and $Ar_2I^+$ coupled with phosphate or antiminate counterions, and mixtures thereof.

4. The liquid polymer precursor of claim 1 wherein the vinyl ether functionalized compounds are selected from the group consisting of difunctional and polyfunctional vinyl ether terminated monomers, oligomers, and mixtures thereof.

5. The liquid polymer precursor of claim 1 wherein the epoxy functionalized compound is present in the precursor in an amount ranging from about 4 to about 7 times the weight of the vinyl ether functionalized compound in the precursor.

6. The liquid polymer precursor of claim 5 wherein the epoxy functionalized compound includes cycloaliphatic diepoxies.

7. The liquid polymer precursor of claim 1 wherein the acrylate functionalized compound is present in the precursor composition in an amount ranging from about 3 to about 5 times the weight of vinyl ether functionalized compound in the precursor.

8. The liquid polymer precursor of claim 7 wherein the acrylate functionalized compound is at least on non-volatile diacrylate having a viscosity of from about 300 to about 1000 centipoise.

9. The liquid polymer precursor of claim 8 including from about 5.0 to about 15 wt % of at least one diol.

10. The liquid polymer precursor of claim 1 further including at least one compound selected from the group consisting of alcohols, diols, polyols, and mixtures thereof.

11. The liquid polymer precursor of claim 1 having a viscosity of from about 200 to about 10,000 centipoise.

12. The liquid polymer precursor of claim 1 including pyrene.

13. The liquid polymer precursor of claim 12 including from about 0.05 to about 0.5 pph pyrene.

14. A liquid polymer precursor comprising:
from about 5 to about 15 weight percent of difunctional, and polyfunctional vinyl ether terminated monomers, oligomers and mixtures thereof;
at least one cycloaliphatic diepoxy in an amount of from 4 to 7 times the amount of the vinyl ether present in the polymer precursor;
at least one non-volatile diacrylate in an amount of from 3 to 5 times the amount of vinyl ether present in the polymer precursor;
at least one cationic photoinitiator;
at least one free radical photoinitiator; and
at least one compound selected from the group consisting of alcohols, diols, polyols, and mixtures thereof wherein the epoxy functionalized compounds, the vinyl ether functionalized compounds and the acrylate functionalized compounds are present in the composition in an amount sufficient to ensure that upon photoinitiation, the epoxy functionalized compounds polymerize primarily by cationic chain transfer polymerization and wherein the vinyl ether functionalized compounds polymerize primarily by radical polymerization and combine with the acrylate functionalized compounds to form a copolymer.

15. A liquid polymer precursor comprising:
from about 5 to about 15 weight percent bis-(4-vinyl oxy butly)isophthalate vinyl ether:
at least one cycloaliphatic diepoxy having the following composition:

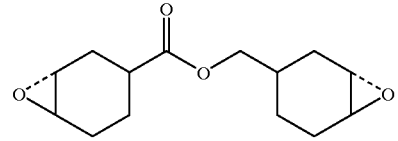

in an amount of from 4 to 7 times the amount of the vinyl ether present in the polymer precursor;
ethoxylated bis phenol A diacrylate in an amount of from 3 to 5 times the amount of vinyl ether present in the polymer precursor;
at least one cationic photoinitiator;
at least one free radical photoinitiator; and
at least one diol or polyol having a molecular weight greater than 200.

* * * * *